United States Patent [19]

Perry

[11] 4,039,241

[45] Aug. 2, 1977

[54] MULTIPLE CONTACT CONNECTORS

[75] Inventor: Kenneth Roy Perry, Ottawa, Canada

[73] Assignee: Northern Telecom Limited, Montreal, Canada

[21] Appl. No.: 737,904

[22] Filed: Nov. 2, 1976

[51] Int. Cl.² .................................................. H05K 1/12
[52] U.S. Cl. ............................ 339/176 M; 339/217 S
[58] Field of Search ............ 339/17 L, 176 R, 176 M, 339/176 MP, 217 S

[56] References Cited

U.S. PATENT DOCUMENTS 3,960,424 6/1976 Weisenburger .................. 339/17 M

*Primary Examiner*—Gerald A. Dost
*Attorney, Agent, or Firm*—Sidney T. Jelly

[57] ABSTRACT

A multiple contact connector, particularly suitable for attachment to printed circuit boards, is a one piece molded body with snap-in contact. From each side further recesses extend into the body, a further recess on each side of a central recess. Each center recess and its associated side recesses are connected by a transverse slot. The contacts, formed from phosphor bronze or other conducting material, are generally Tee shaped, having a stem positioned in the central recess and laterally extending arms passing through the slots and having enlarged ends which are positioned in the side recesses. The end of the stem is formed into spring contact portions to receive male contacts. The extreme ends of the laterally extending arms are formed into contacts which enter holes in the printed circuit board. A small web at an inner corner of each side recess acts to retain the contact in the body, the laterally extending arms clipping under the webs.

7 Claims, 14 Drawing Figures

MULTIPLE CONTACT CONNECTORS

This invention relates to a multiple contact connector, particularly for attachment to circuit boards, such as printed circuit boards, for connection of such circuit boards into a system. A particular use is for connection of repeaters into a telecommunications system.

Connectors have conventionally been made of two parts of electrically insulating material assembled together, contacts being preassembled into one or other of the parts before assembly. The contacts are thus held in position once the two connector parts are assembled. The present invention provides a single piece molded connector body with snap-in contacts. There is obtained a considerable cost reduction and at the same time there is a reduction in the cross-sectional dimensions. When attached to a printed circuit board, or other circuit board, the connector occupies less room. However, the connector can be used to connect into a system originally intended to accept conventional connectors — that is the conventional and the new form of connector are interchangeable insofar as connection to the system is concerned. A connector in accordance with the present invention can be mounted on a single circuit board, or mounted between two circuit boards and electrically connected to each.

The invention will be readily understood by the following description of certain embodiments, by way of example, in conjunction with the accompanying drawings, in which.

Figure 3:
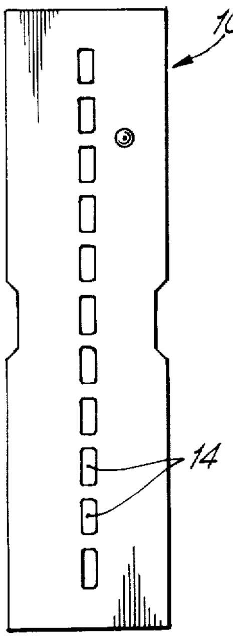
FIG. 3 is a bottom plan view of the connector body of FIG. 1.
Figure 2:
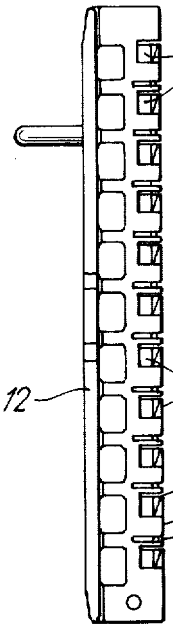
FIG. 2 is a side view of the connector body of FIG. 1.
Figure 1:
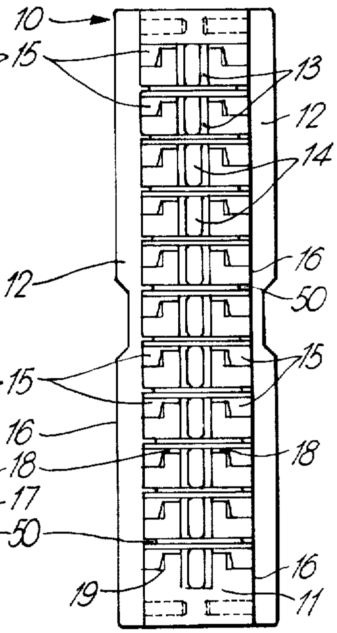
FIG. 1 is a top plan view of a connector body.

The connector body 10, as illustrated in FIGS. 1 to 3 is a one piece plastic molding and is elongated to provide spaces for up to eleven contacts, in the present example. The body has a main center portion 11 with a narrow thin flange or web 12 along each side at the bottom surface. Formed in the center portion 11 are central recesses 13, into which contacts are inserted. The recesses 13 extend very nearly through the body as is seen more clearly in FIGS. 6 and 7. A narrow slot 14 extends from the base of each recess 13 through the remaining portion of the body to the base surface thereof. A further recess 15 is provided on each side of each central recess 13, the recesses 15 extending inwards from the side surfaces 16 of the body 10. The recesses 15 extend down from the top surface 17 of the body 10 — in the present example about one-third of the total thickness of the body 10. Again, recesses 15 are seen more clearly in FIGS. 6 and 7.

Figure 5:
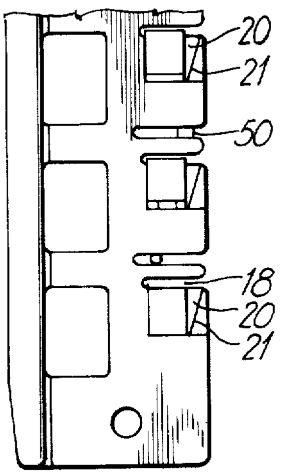
FIG. 5 is a side view of the end of the connector illustrated in FIG. 4.
Figure 4:
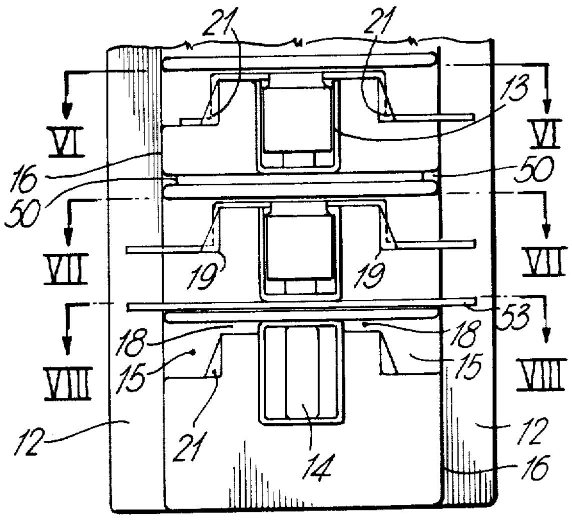
FIG. 4 is a top plan view of one end of a connector having a body member as in FIGS. 1 to 3, to an enlarged scale, showing two forms of contact inserted and a cross-connect member.

The recesses 15 on each side of a central recess 13 are each connected to the central recess by a thin slot 18. The inner corner 19 of each recess 15, remote from the slot 18, is given a particular formation which acts to retain the contact in the recesses 13 and 15 and also provides an inclined surface which deflects parts of the contacts as it is inserted, the parts snapping back under the corner when the contact is fully inserted. As seen more clearly in FIGS. 4 and 5, a thin web 20 extends across the corner 19. The thin web 20 has an upper surface 21 which is inclined downwardly from the top surface 17 towards the related recess 15. This surface 21 forms a ramp for deflection of the contact part as will be described later.

Figure 6:
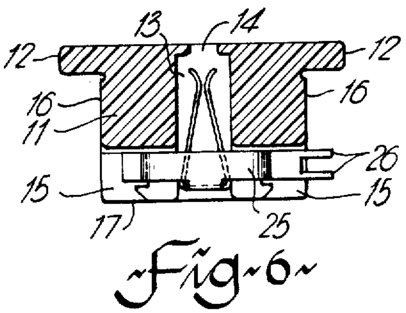
FIG. 6 is a cross-section of the line VI—VI of FIG. 4.
Figure 7:
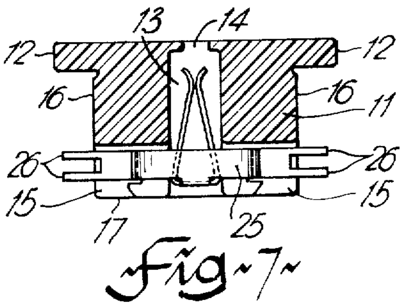
FIG. 7 is a cross-section on the line VII—VII of FIG. 4.

FIGS. 6 and 7 illustrate two alternate forms of contact 25 inserted in a connector body. The contact illustrated in FIG. 6 has terminals 26 extending from one side only while the contact 25 illustrated in FIG. 7 has terminals 26 extending from both sides of the main center portion 11. FIGS. 9, 10, 11 and 12 illustrate in more detail the contact 25 of the form in FIG. 7.

The contact 25 is formed by a stamping and forming from, for example, phosphor bronze strip, with two main portions 30 and 31 extending somewhat in a Tee formation. What can be considered as the stem portion 30 comprises two opposed contact legs 32, each leg bifurcated. The legs are bent down from the basic strip at 33, the legs inclined towards each other and having arcuate ends 34. The top portion 31 is bent from the plane of the basic strip at 35 with the ends formed to give a cranked formation at each side of the stem portion 30. The extreme ends of the top portion 31, in the present example, are bifurcated to form the terminals 26 which pass into round holes in the circuit board. In an alternative form, if rectangular holes are punched or otherwise formed in the circuit board the ends do not need to be bifurcated.

The top portion 31, in the present example, is therefore in sections, a central top section 31*a*, two end sections 31*b* which include the terminals 26, and intermediate sections 31*c*. The sections 31*b* extend substantially parallel to the central section 31*a* but displaced therefrom, the end sections 31*b* connected to central section 31*a* by the intermediate sections 31*c*. Sections 31*c* extend substantially at right angles to sections 31*a* to 31*b*.

This formation of the top portion 31 is such as to fit into the recesses 15 and connecting slot 18 in the center portion 11 of the connector body 10, while the stem portion 31 extends down into the recess 13, as seen in FIGS. 4 to 7. The junctions between the end sections 31*b* and intermediate sections 31*c* — indicated at 38 — fit under the webs 20 at the inner corners 19 of the recesses 15 and retain the contacts 25 in the connector body 10.

Contacts are inserted by first positioning the stem portion 30 into a recess 15 with the central section 31*a* of the top portion 31 overlying the slots 18. Gentle pressure on the contact causes the junctions 38 to slide down the inclined surfaces 21 of the webs 20, flexing the top portion at the junctions between the central section 31*a* and sections 31*c* until the junctions 38 snap under the webs 20. Contacts can be removed, if necessary, by flexing the top portion by pushing sideways on the contacts 26, to deflect the junctions 38 from under the webs 20.

Figure 14:
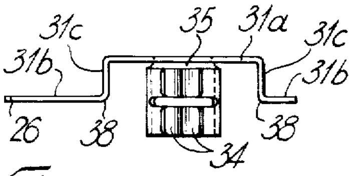
FIGs. 13 and 14 are side and bottom views respectively of alternative form of contact for use with the connector body of FIGS. 1 to 3 and as illustrated in FIGS. 4, 5 and 6.
Figure 13:
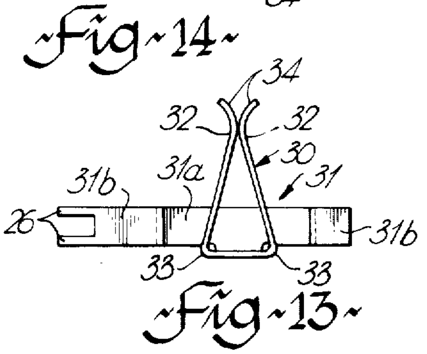
Figure 9:
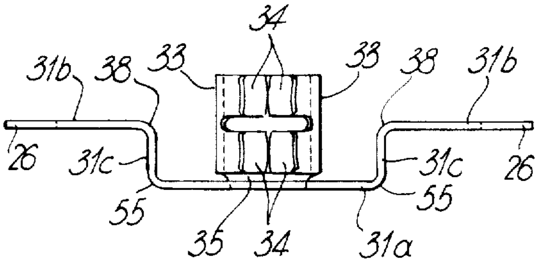
FIGS. 9, 10 and 11 are side, bottom and end views respectively of one form of contact, for use with the connector body of FIGS. 1 to 3 and as illustrated in FIGS. 4, 5, and 7.
Figure 12:
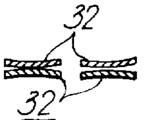
FIG. 12 is a cross-section on the line XII—XII of FIG. 11.
Figure 11:
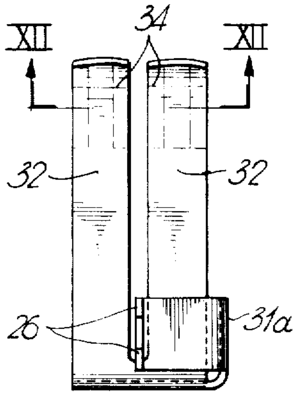
Figure 10:
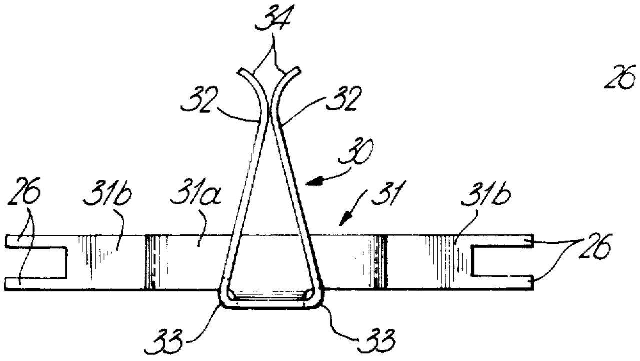

The form of contact 25 illustrated in FIG. 6 and FIGS. 13 and 14 is substantially the same as contacts 25 of FIG. 7 and FIGS. 9 to 13, the only difference being that the bifurcated contacts 26 are not provided on one end portion **31*b***. Insertion is as described above.

When two printed circuit boards are to be attached to the connector body 10, it is usually necessary to provided interconnections between the boards, additional to such interconnections as are made via the contacts 25. Conventionally this has been done by flexible conductors at the ends of the printed circuit boards remote from the ends attached to the connector body. An alternative form of interconnections can be provided by clip-in connectors in the connector body 10.

Figure 8:
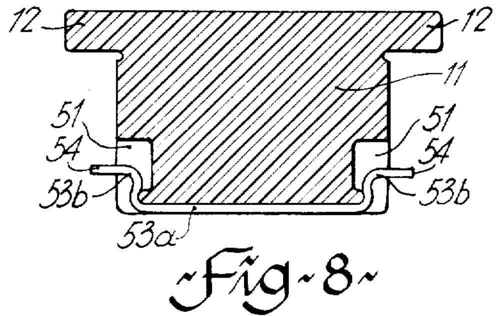
FIG. 8 is a cross-section on the line VIII—VIII of FIG. 4.

As illustrated in FIGS. 1 and 2, 4 and 5, grooves 50 are formed in the main center portion 11 of the connector body 10. The grooves 50 extend across the top surface 17 of the central portion 11, and also down each side surface 16. The grooves 50 in each side surface are also undercut at 51, FIG. 8. Adapted to clip in the grooves 50 are connectors 53. Each connector has a central portion **53*a* which fits in the part of the groove 50 in surface 17 and two end portions 53*b* bent in a somewhat "S" shape to fit in the grooves 50 in the side surfaces 16 and to enter into the undercut portions 51. The extreme ends 54 extend laterally for entry into associated holes in the printed circuit boards. The number and positioning of of connectors 53 can be varied as can also the number and positioning of the contacts 25**.

Conveniently, on assembly of one, or two, printed circuit boards to the connector body, the terminals 26 which project through holes in the printed circuit boards, are wave soldered to the connection positions on the circuits of the boards. Similarly, the end 54 of the connectors 53 can be wave soldered to appropriate connection positions, The contacts are particularly suited to being made by punching from strip material such that all active bends, that is the bends involved in the spring action of the terminals, are all across the grain of the material. Thus, the bends at the junctions 38 between sections **31*b* and 31*c* and at the junctions 55 between sections 31*a* and 31*c*, and the bending of the arcuate ends 34 of the legs 32 all extend across the grain, only bend at 35**, which is not an active bend, extending along the grain. This provides improved characteristics and avoidance of cracking.

What is claimed is:

1. A multiple contact connector, comprising:

an elongate connector body of electrically insulating material and including a longitudinally extending central portion having a top surface and side surfaces;

a plurality of central recesses in said central portion, said central recesses spaced along said central portion and extending down from said top surface;

a slot extending from the base of each central recess through to a base surface of said body;

a plurality of further recesses spaced along said central portion, a further recess of each side of each central recess, each further recess extending downward from said top surface and inward from the related side surface;

a plurality of transverse slots extending across said top surface, each slot interconnecting a central recess and the further recesses on each side of the central recess to form a common side surface to the central recess and associated further recesses;

each of said further recesses including an inner corner spaced from the related transverse slot and a web extending across said inner corner to provide an undercut formation, and an inclined upper surface on said web, said inclined surface sloping downward toward the related further recess;

a plurality of contacts in said body, a contact in each of at least some of said central recesses, each said contact comprising; a stem portion having two opposed contact legs, said legs extending into a central recess and including lower ends positioned adjacent to the slot extending from the central recess to said base surface; a top portion including a central section extending laterally normal to said stem portion, an intermediate section at each end of said central portion and extending substantially normal thereto and an end section extending from each intermediate section and extending substantially normal thereto and in a direction away from said central section, said central section positioned in the transverse slot associated with said central recess, said intermediate and end sections positioned in the further recesses on either side of said central recess, the junction between each intermediate section and the associated end section forming a corner positioned under said web extending across said inner corner of each further recess, at least one end section extending from a further recess to form a terminal.

2. A connector as claimed in claim 1, each contact including an end section extending from both further recesses to form terminals at each end of the top portion of the contact.

3. A connector as claimed in claim 1, each of said contact legs bifurcated.

4. A connector as claimed in claim 1, each contact formed from strip metal.

5. A connector as claimed in claim 1, including a plurality of grooves extending across said central portion of said body, said grooves in said top surface and including portions extending at least part way down each side surface, said portions extending down said side surfaces forming undercut portions, a groove associated with each of at least some of said central recesses and positioned between a central recess and an adjacent transverse slot; and a connector in at least some of said grooves, each connector including a central portion positioned in that part of a groove in said top surface and two end portions, each end portion including a first part extending normal to said central portion and positioned in said portions of said grooves extending down said side surfaces and extreme end parts extending outwardly from said central portion of said body, substantially parallel to said central portion of said connector.

6. A connector as claimed in claim 5, said first parts of said end portions of said connectors inclined inwardly to engage in said undercut portions of said grooves.

7. A connector as claimed in claim 1, including a flange extending along each side of said central portion of said body at said base surface thereof.

* * * * *